US011806800B2

(12) United States Patent
Backlund et al.

(10) Patent No.: US 11,806,800 B2
(45) Date of Patent: *Nov. 7, 2023

(54) X-RAY CALIBRATION STANDARD OBJECT

(71) Applicant: Arcam AB, Mölnlycke (SE)

(72) Inventors: Johan Backlund, Onsala (SE); Martin Wildheim, Moelndal (SE)

(73) Assignee: Arcam AB, Mölnlycke (SE)

( * ) Notice: Subject to any disclaimer, the term of this patent is extended or adjusted under 35 U.S.C. 154(b) by 530 days.

This patent is subject to a terminal disclaimer.

(21) Appl. No.: 17/018,439

(22) Filed: Sep. 11, 2020

(65) Prior Publication Data

US 2020/0406389 A1 Dec. 31, 2020

Related U.S. Application Data

(63) Continuation of application No. 15/245,542, filed on Aug. 24, 2016, now Pat. No. 10,807,187.

(Continued)

(51) Int. Cl.
*B23K 15/00* (2006.01)
*G01T 1/29* (2006.01)
(Continued)

(52) U.S. Cl.
CPC .......... *B23K 15/0013* (2013.01); *B22F 10/28* (2021.01); *B22F 10/31* (2021.01);
(Continued)

(58) Field of Classification Search
None
See application file for complete search history.

(56) References Cited

U.S. PATENT DOCUMENTS 2,264,968 A  12/1941 De Forest
2,323,715 A   7/1943 Kuehni
(Continued)

FOREIGN PATENT DOCUMENTS

CA  2860188 A1  6/2006
CN  1606129 A   4/2005
(Continued)

OTHER PUBLICATIONS

Machine translation of WO0204932A1, Feb. 2023 (Year: 2023).*
(Continued)

*Primary Examiner* — Geoffrey S Evans
(74) *Attorney, Agent, or Firm* — Dinsmore & Shohl LLP

(57) ABSTRACT

A standard reference plate is configured for insertion into an additive manufacturing apparatus for calibrating an electron beam of the additive manufacturing apparatus. The standard reference plate includes a lower plate and an upper plate being essentially in parallel and attached spaced apart from each other, the upper plate including a plurality of holes. A predetermined hollow pattern is provided inside the holes, and a spacing between the holes and the size of the holes and a distance between the upper plate and the lower plate and a position of an x-ray sensor of the additive manufacturing apparatus with respect to the standard reference plate are arranged so that x-rays emanating from the lower plate, when the electron beam is passing through a hollow part of the hollow pattern, will not pass directly from the lower plate through any one of the holes to the x-ray sensor.

20 Claims, 6 Drawing Sheets

Related U.S. Application Data

(60) Provisional application No. 62/232,135, filed on Sep. 24, 2015.

(51) Int. Cl.

| | | |
|---|---|---|
| *B29C 64/153* | (2017.01) | |
| *B33Y 50/00* | (2015.01) | |
| *H01J 37/305* | (2006.01) | |
| *B29C 64/20* | (2017.01) | |
| *B22F 10/28* | (2021.01) | |
| *B22F 12/90* | (2021.01) | |
| *B22F 10/31* | (2021.01) | |
| *B22F 12/52* | (2021.01) | |
| *B22F 12/55* | (2021.01) | |
| *B22F 10/32* | (2021.01) | |
| *B22F 10/36* | (2021.01) | |
| *B33Y 10/00* | (2015.01) | |
| *B33Y 50/02* | (2015.01) | |
| *H01J 37/30* | (2006.01) | |

(52) U.S. Cl.
CPC ............ *B22F 12/90* (2021.01); *B23K 15/002* (2013.01); *B23K 15/0086* (2013.01); *B29C 64/153* (2017.08); *B29C 64/20* (2017.08); *B33Y 50/00* (2014.12); *G01T 1/29* (2013.01); *H01J 37/305* (2013.01); *B22F 10/32* (2021.01); *B22F 10/36* (2021.01); *B22F 12/52* (2021.01); *B22F 12/55* (2021.01); *B33Y 10/00* (2014.12); *B33Y 50/02* (2014.12); *H01J 37/3002* (2013.01); *H01J 2237/2445* (2013.01); *H01J 2237/30433* (2013.01); *H01J 2237/30472* (2013.01); *Y02P 10/25* (2015.11)

(56) References Cited

U.S. PATENT DOCUMENTS

| | | |
|---|---|---|
| 3,634,644 A | 1/1972 | Ogden et al. |
| 3,838,496 A | 10/1974 | Kelly |
| 3,882,477 A | 5/1975 | Mueller |
| 3,906,229 A | 9/1975 | Demeester et al. |
| 3,908,124 A | 9/1975 | Rose |
| 4,314,134 A | 2/1982 | Schumacher et al. |
| 4,348,576 A | 9/1982 | Anderl et al. |
| 4,352,565 A | 10/1982 | Rowe et al. |
| 4,401,719 A | 8/1983 | Kobayashi et al. |
| 4,541,055 A | 9/1985 | Wolfe et al. |
| 4,651,002 A | 3/1987 | Anno |
| 4,818,562 A | 4/1989 | Arcella et al. |
| 4,863,538 A | 9/1989 | Deckard |
| 4,888,490 A | 12/1989 | Bass et al. |
| 4,927,992 A | 5/1990 | Whitlow et al. |
| 4,958,431 A | 9/1990 | Clark et al. |
| 4,988,844 A | 1/1991 | Dietrich et al. |
| 5,118,192 A | 6/1992 | Chen et al. |
| 5,135,695 A | 8/1992 | Marcus |
| 5,167,989 A | 12/1992 | Dudek et al. |
| 5,182,170 A | 1/1993 | Marcus et al. |
| 5,204,055 A | 4/1993 | Sachs et al. |
| 5,247,560 A | 9/1993 | Hosokawa et al. |
| 5,393,482 A | 2/1995 | Benda et al. |
| 5,483,036 A | 1/1996 | Giedt et al. |
| 5,508,489 A | 4/1996 | Benda et al. |
| 5,511,103 A | 4/1996 | Hasegawa |
| 5,595,670 A | 1/1997 | Mombo Caristan |
| 5,647,931 A | 7/1997 | Retallick et al. |
| 5,753,274 A | 5/1998 | Wilkening et al. |
| 5,837,960 A | 11/1998 | Lewis et al. |
| 5,876,550 A | 3/1999 | Feygin et al. |
| 5,904,890 A | 5/1999 | Lohner et al. |
| 5,932,290 A | 8/1999 | Lombardi et al. |
| 6,046,426 A | 4/2000 | Jeantette et al. |
| 6,134,297 A * | 10/2000 | Chao .................... A61B 6/06 |
| | | 378/98.12 |
| 6,162,378 A | 12/2000 | Bedal et al. |
| 6,204,469 B1 | 3/2001 | Fields et al. |
| 6,207,962 B1 | 3/2001 | Okino |
| 6,419,203 B1 | 7/2002 | Dang |
| 6,537,052 B1 | 3/2003 | Adler |
| 6,554,600 B1 | 4/2003 | Hofmann et al. |
| 6,583,379 B1 | 6/2003 | Meiners et al. |
| 6,676,892 B2 | 1/2004 | Das et al. |
| 6,724,001 B1 | 4/2004 | Pinckney et al. |
| 6,746,506 B2 | 6/2004 | Liu et al. |
| 6,751,516 B1 | 6/2004 | Richardson |
| 6,764,636 B1 | 7/2004 | Allanic et al. |
| 6,811,744 B2 | 11/2004 | Keicher et al. |
| 6,815,636 B2 | 11/2004 | Chung et al. |
| 6,824,714 B1 | 11/2004 | Türck et al. |
| 7,003,864 B2 | 2/2006 | Dirscherl |
| 7,020,539 B1 | 3/2006 | Kovacevic et al. |
| 7,098,464 B2 | 8/2006 | Sohda et al. |
| 7,165,498 B2 | 1/2007 | Mackrill et al. |
| 7,204,684 B2 | 4/2007 | Ederer et al. |
| 7,291,002 B2 | 11/2007 | Russell et al. |
| 7,452,500 B2 | 11/2008 | Uckelmann |
| 7,454,262 B2 | 11/2008 | Larsson et al. |
| 7,537,722 B2 | 5/2009 | Andersson et al. |
| 7,540,738 B2 | 6/2009 | Larsson et al. |
| 7,569,174 B2 | 8/2009 | Ruatta et al. |
| 7,635,825 B2 | 12/2009 | Larsson |
| 7,686,605 B2 | 3/2010 | Perret et al. |
| 7,696,501 B2 | 4/2010 | Jones |
| 7,713,454 B2 | 5/2010 | Arsson |
| 7,754,135 B2 | 7/2010 | Abe et al. |
| 7,799,253 B2 | 9/2010 | Höchsmann et al. |
| 7,871,551 B2 | 1/2011 | Wallgren et al. |
| 7,901,136 B2 | 3/2011 | Harding |
| 8,021,138 B2 | 9/2011 | Green |
| 8,083,513 B2 | 12/2011 | Montero-Escuder et al. |
| 8,137,739 B2 | 3/2012 | Philippi et al. |
| 8,187,521 B2 | 5/2012 | Larsson et al. |
| 8,308,466 B2 | 11/2012 | Ackelid et al. |
| 8,331,536 B2 | 12/2012 | Shaw et al. |
| 8,992,816 B2 | 3/2015 | Jonasson et al. |
| 9,073,265 B2 | 7/2015 | Snis |
| 9,079,248 B2 | 7/2015 | Ackelid |
| 9,126,167 B2 | 9/2015 | Ljungblad |
| 9,254,535 B2 | 2/2016 | Buller et al. |
| 9,310,188 B2 | 4/2016 | Snis |
| 9,505,172 B2 | 11/2016 | Ljungblad |
| 9,550,207 B2 | 1/2017 | Ackelid |
| 9,664,505 B2 | 5/2017 | Snis |
| 9,802,253 B2 | 10/2017 | Jonasson |
| 9,950,367 B2 | 4/2018 | Backlund et al. |
| 10,071,422 B2 | 9/2018 | Buller et al. |
| 10,807,187 B2 * | 10/2020 | Backlund ................ B22F 10/28 |
| 2002/0104973 A1 | 8/2002 | Kerekes |
| 2002/0152002 A1 | 10/2002 | Lindemann et al. |
| 2002/0195747 A1 | 12/2002 | Hull et al. |
| 2003/0043360 A1 | 3/2003 | Farnworth |
| 2003/0133822 A1 | 7/2003 | Harryson |
| 2003/0205851 A1 | 11/2003 | Laschutza et al. |
| 2004/0012124 A1 | 1/2004 | Li et al. |
| 2004/0026807 A1 | 2/2004 | Andersson et al. |
| 2004/0084814 A1 | 5/2004 | Boyd et al. |
| 2004/0104499 A1 | 6/2004 | Keller |
| 2004/0131158 A1 * | 7/2004 | Hoheisel ................. G21K 1/10 |
| | | 378/154 |
| 2004/0148048 A1 | 7/2004 | Farnworth |
| 2004/0173496 A1 | 9/2004 | Srinivasan |
| 2004/0173946 A1 | 9/2004 | Pfeifer et al. |
| 2004/0204765 A1 | 10/2004 | Fenning et al. |
| 2004/0217095 A1 | 11/2004 | Herzog |
| 2005/0117707 A1 * | 6/2005 | Baier ....................... G21K 1/04 |
| | | 378/156 |
| 2005/0173380 A1 | 8/2005 | Carbone |
| 2005/0186538 A1 | 8/2005 | Uckelmann |
| 2005/0282300 A1 | 12/2005 | Yun et al. |
| 2006/0108712 A1 | 5/2006 | Mattes |
| 2006/0138325 A1 | 6/2006 | Choi |

(56) References Cited

U.S. PATENT DOCUMENTS

| | | | |
|---|---|---|---|
| 2006/0145381 A1 | 7/2006 | Larsson | |
| 2006/0147332 A1 | 7/2006 | Jones et al. | |
| 2006/0157892 A1 | 7/2006 | Larsson | |
| 2006/0158755 A1* | 7/2006 | Matsuda | G21K 1/06 359/853 |
| 2006/0180957 A1 | 8/2006 | Hopkinson et al. | |
| 2006/0284088 A1 | 12/2006 | Fukunaga et al. | |
| 2007/0074659 A1 | 4/2007 | Wahlstrom | |
| 2007/0175875 A1 | 8/2007 | Uckelmann et al. | |
| 2007/0179655 A1 | 8/2007 | Farnworth | |
| 2007/0182289 A1 | 8/2007 | Kigawa et al. | |
| 2007/0298182 A1 | 12/2007 | Perret et al. | |
| 2008/0236738 A1 | 10/2008 | Lo et al. | |
| 2009/0017219 A1 | 1/2009 | Paasche et al. | |
| 2009/0152771 A1 | 6/2009 | Philippi et al. | |
| 2009/0206056 A1 | 8/2009 | Xu et al. | |
| 2010/0007062 A1 | 1/2010 | Larsson et al. | |
| 2010/0260410 A1 | 10/2010 | Taminger et al. | |
| 2010/0305743 A1 | 12/2010 | Larsson | |
| 2010/0310404 A1 | 12/2010 | Ackelid | |
| 2010/0316856 A1 | 12/2010 | Currie et al. | |
| 2011/0061591 A1 | 3/2011 | Stecker | |
| 2011/0099790 A1 | 5/2011 | Tonami | |
| 2011/0114839 A1 | 5/2011 | Stecker et al. | |
| 2011/0133367 A1 | 6/2011 | Weidinger et al. | |
| 2011/0240607 A1 | 10/2011 | Stecker et al. | |
| 2011/0241575 A1 | 10/2011 | Caiafa et al. | |
| 2011/0293770 A1 | 12/2011 | Ackelid et al. | |
| 2011/0293771 A1 | 12/2011 | Oberhofer et al. | |
| 2011/0309554 A1 | 12/2011 | Liska et al. | |
| 2011/0316178 A1 | 12/2011 | Uckelmann | |
| 2012/0100031 A1 | 4/2012 | Ljungblad | |
| 2012/0134469 A1 | 5/2012 | Funk et al. | |
| 2012/0164322 A1 | 6/2012 | Teulet | |
| 2012/0183701 A1 | 7/2012 | Pilz et al. | |
| 2012/0193530 A1 | 8/2012 | Parker et al. | |
| 2012/0211155 A1 | 8/2012 | Wehning et al. | |
| 2012/0223059 A1 | 9/2012 | Ljungblad | |
| 2012/0225210 A1 | 9/2012 | Fruth | |
| 2012/0237745 A1 | 9/2012 | Dierkes et al. | |
| 2012/0266815 A1 | 10/2012 | Brunermer | |
| 2013/0055568 A1 | 3/2013 | Dusel et al. | |
| 2013/0162134 A1 | 6/2013 | Mattausch et al. | |
| 2013/0186514 A1 | 7/2013 | Zhuang et al. | |
| 2013/0216959 A1 | 8/2013 | Tanaka et al. | |
| 2013/0233846 A1 | 9/2013 | Jakimov et al. | |
| 2013/0264750 A1 | 10/2013 | Hofacker et al. | |
| 2013/0270750 A1 | 10/2013 | Green | |
| 2013/0278920 A1 | 10/2013 | Loewgren | |
| 2013/0299699 A1 | 11/2013 | Nakayama et al. | |
| 2013/0300286 A1 | 11/2013 | Ljungblad et al. | |
| 2013/0315369 A1* | 11/2013 | Turner | G01N 23/20008 378/87 |
| 2013/0343947 A1 | 12/2013 | Satzger et al. | |
| 2014/0175708 A1 | 6/2014 | Echigo et al. | |
| 2014/0198365 A1* | 7/2014 | Li | B33Y 30/00 359/201.2 |
| 2014/0271964 A1 | 9/2014 | Roberts, IV et al. | |
| 2014/0301884 A1 | 10/2014 | Hellestam et al. | |
| 2014/0308153 A1 | 10/2014 | Ljungblad | |
| 2014/0314609 A1 | 10/2014 | Ljungblad et al. | |
| 2014/0314964 A1 | 10/2014 | Ackelid | |
| 2014/0326881 A1* | 11/2014 | Nishikata | G01N 23/223 250/310 |
| 2014/0348691 A1 | 11/2014 | Ljungblad et al. | |
| 2014/0363327 A1 | 12/2014 | Holcomb | |
| 2014/0367367 A1 | 12/2014 | Wood et al. | |
| 2015/0004045 A1 | 1/2015 | Ljungblad | |
| 2015/0050463 A1 | 2/2015 | Nakano et al. | |
| 2015/0071809 A1 | 3/2015 | Nordkvist et al. | |
| 2015/0086409 A1 | 3/2015 | Hellestam | |
| 2015/0088295 A1 | 3/2015 | Hellestam | |
| 2015/0124929 A1* | 5/2015 | Minot | G21K 1/025 427/160 |
| 2015/0130118 A1 | 5/2015 | Cheng et al. | |
| 2015/0139849 A1 | 5/2015 | Pialot, Jr. et al. | |
| 2015/0151490 A1 | 6/2015 | Jonasson et al. | |
| 2015/0165524 A1 | 6/2015 | Ljungblad et al. | |
| 2015/0165525 A1 | 6/2015 | Jonasson | |
| 2015/0174658 A1 | 6/2015 | Ljungblad | |
| 2015/0174695 A1 | 6/2015 | Elfstroem et al. | |
| 2015/0251249 A1 | 9/2015 | Fager | |
| 2015/0273622 A1 | 10/2015 | Manabe | |
| 2015/0283610 A1 | 10/2015 | Ljungblad et al. | |
| 2015/0283613 A1 | 10/2015 | Backlund et al. | |
| 2015/0290710 A1 | 10/2015 | Ackelid | |
| 2015/0306819 A1 | 10/2015 | Ljungblad | |
| 2015/0318066 A1* | 11/2015 | Beck | G21K 1/10 29/469 |
| 2016/0052056 A1 | 2/2016 | Fager | |
| 2016/0052079 A1 | 2/2016 | Ackelid | |
| 2016/0054115 A1 | 2/2016 | Snis | |
| 2016/0054121 A1 | 2/2016 | Snis | |
| 2016/0054347 A1 | 2/2016 | Snis | |
| 2016/0059314 A1 | 3/2016 | Ljungblad et al. | |
| 2016/0099282 A1* | 4/2016 | Vora | H01L 27/14676 438/69 |
| 2016/0129501 A1 | 5/2016 | Loewgren et al. | |
| 2016/0167160 A1 | 6/2016 | Hellestam | |
| 2016/0167303 A1 | 6/2016 | Petelet | |
| 2016/0189921 A1 | 6/2016 | Sotirelis et al. | |
| 2016/0202042 A1 | 7/2016 | Snis | |
| 2016/0202043 A1 | 7/2016 | Snis | |
| 2016/0211116 A1 | 7/2016 | Lock | |
| 2016/0236279 A1 | 8/2016 | Ashton et al. | |
| 2016/0279735 A1 | 9/2016 | Hellestam | |
| 2016/0282848 A1 | 9/2016 | Hellestam | |
| 2016/0303687 A1 | 10/2016 | Ljungblad | |
| 2016/0307731 A1 | 10/2016 | Lock | |
| 2016/0311021 A1 | 10/2016 | Elfstroem | |
| 2017/0080494 A1 | 3/2017 | Ackelid | |
| 2017/0106443 A1 | 4/2017 | Karlsson | |
| 2017/0106570 A1 | 4/2017 | Karlsson | |
| 2017/0136541 A1 | 5/2017 | Fager | |
| 2017/0136542 A1 | 5/2017 | Nordkvist et al. | |
| 2017/0173691 A1 | 6/2017 | Jonasson | |
| 2017/0189964 A1 | 7/2017 | Backlund et al. | |
| 2017/0227417 A1 | 8/2017 | Snis | |
| 2017/0227418 A1 | 8/2017 | Snis | |
| 2017/0246684 A1 | 8/2017 | Hellestam | |
| 2017/0246685 A1 | 8/2017 | Hellestam | |
| 2017/0259338 A1 | 9/2017 | Ackelid | |
| 2017/0282248 A1 | 10/2017 | Ljungblad et al. | |
| 2017/0294288 A1 | 10/2017 | Lock | |
| 2017/0341141 A1 | 11/2017 | Ackelid | |
| 2017/0341142 A1 | 11/2017 | Ackelid | |
| 2017/0348791 A1 | 12/2017 | Ekberg | |
| 2017/0348792 A1 | 12/2017 | Fager | |
| 2018/0009033 A1 | 1/2018 | Fager | |
| 2018/0154444 A1 | 6/2018 | Jonasson | |

FOREIGN PATENT DOCUMENTS

| | | |
|---|---|---|
| CN | 101100703 A | 1/2008 |
| CN | 101421823 A | 4/2009 |
| CN | 101607311 A | 12/2009 |
| CN | 101635210 A | 1/2010 |
| CN | 101738872 A | 6/2010 |
| CN | 101821081 A | 9/2010 |
| CN | 201693176 U | 1/2011 |
| CN | 101607311 B | 9/2011 |
| CN | 102202226 A | 9/2011 |
| CN | 203509463 U | 4/2014 |
| DE | 19952998 A1 | 5/2001 |
| DE | 20305843 U1 | 7/2003 |
| DE | 10235434 A1 | 2/2004 |
| DE | 102005014483 A1 | 10/2006 |
| DE | 202008005417 U1 | 8/2008 |
| DE | 102007018601 A1 | 10/2008 |
| DE | 102007029052 A1 | 1/2009 |
| DE | 102008012064 A1 | 9/2009 |
| DE | 102010041284 A1 | 3/2012 |
| DE | 102011105045 B3 | 6/2012 |

(56) References Cited

FOREIGN PATENT DOCUMENTS

| | | |
|---|---|---|
| DE | 102013210242 A1 | 12/2014 |
| EP | 0289116 A1 | 11/1988 |
| EP | 0322257 A2 | 6/1989 |
| EP | 0333098 A2 | 9/1989 |
| EP | 0688262 A1 | 12/1995 |
| EP | 1358994 A1 | 11/2003 |
| EP | 1418013 A1 | 5/2004 |
| EP | 1466718 A2 | 10/2004 |
| EP | 1486318 A2 | 12/2004 |
| EP | 1523028 A2 | 4/2005 |
| EP | 1669143 A1 | 6/2006 |
| EP | 1683593 A2 | 7/2006 |
| EP | 1721725 A1 | 11/2006 |
| EP | 1752240 A1 | 2/2007 |
| EP | 1952932 A2 | 8/2008 |
| EP | 2011631 A1 | 1/2009 |
| EP | 2119530 A1 | 11/2009 |
| EP | 2281677 A1 | 2/2011 |
| EP | 2289652 A1 | 3/2011 |
| EP | 2292357 A1 | 3/2011 |
| EP | 2832474 A1 | 2/2015 |
| FR | 2980380 A1 | 3/2013 |
| JP | H05-171423 A | 7/1993 |
| JP | 2002043207 A | 2/2002 |
| JP | 2003241394 A | 8/2003 |
| JP | 2003245981 | 9/2003 |
| JP | 2005142259 A | 6/2005 |
| JP | 2009006509 A | 1/2009 |
| SE | 524467 C2 | 8/2004 |
| WO | 1993/008928 A1 | 5/1993 |
| WO | 1996/012607 A1 | 5/1996 |
| WO | 1997/037523 A2 | 10/1997 |
| WO | WO-0067043 A1 * 11/2000 | ............ G01T 1/28 |
| WO | 2001/081031 A1 | 11/2001 |
| WO | 2001/085386 A2 | 11/2001 |
| WO | 2002/008653 A1 | 1/2002 |
| WO | WO-0204932 A1 * 1/2002 | ............ G01N 23/04 |
| WO | 2004/007124 A1 | 1/2004 |
| WO | 2004/043680 A2 | 5/2004 |
| WO | 2004/054743 A1 | 7/2004 |
| WO | 2004/056511 A1 | 7/2004 |
| WO | 2004/106041 A2 | 12/2004 |
| WO | 2004/108398 A1 | 12/2004 |
| WO | 2006/091097 A2 | 8/2006 |
| WO | 2006/121374 A1 | 11/2006 |
| WO | 2007/112808 A1 | 10/2007 |
| WO | 2007/147221 A1 | 12/2007 |
| WO | 2008/013483 A1 | 1/2008 |
| WO | 2008/057844 A1 | 5/2008 |
| WO | 2008/074287 A1 | 6/2008 |
| WO | 2008/125497 A1 | 10/2008 |
| WO | 2008/147306 A1 | 12/2008 |
| WO | 2009/000360 A1 | 12/2008 |
| WO | 2009/072935 A1 | 6/2009 |
| WO | 2009/084991 A1 | 7/2009 |
| WO | WO-2010010607 A1 * 1/2010 | ............ G21K 1/025 |
| WO | 2010/095987 A1 | 8/2010 |
| WO | 2010/125371 A1 | 11/2010 |
| WO | 2011/008143 A1 | 1/2011 |
| WO | 2011/011818 A1 | 2/2011 |
| WO | 2011/030017 A1 | 3/2011 |
| WO | 2011/060312 A2 | 5/2011 |
| WO | 2012054195 A2 | 4/2012 |
| WO | 2012/102655 A1 | 8/2012 |
| WO | 2013/092997 A1 | 6/2013 |
| WO | 2013/098050 A1 | 7/2013 |
| WO | 2013/098135 A1 | 7/2013 |
| WO | 2013/159811 A1 | 10/2013 |
| WO | 2013/167194 A1 | 11/2013 |
| WO | 2013/178825 A2 | 12/2013 |
| WO | 2014/071968 A1 | 5/2014 |
| WO | 2014/092651 A1 | 6/2014 |
| WO | 2014/095200 A1 | 6/2014 |
| WO | 2014/095208 A1 | 6/2014 |
| WO | 2014/195068 A1 | 12/2014 |
| WO | 2015/032590 A2 | 3/2015 |
| WO | 2015/091813 A1 | 6/2015 |
| WO | 2015/120168 A1 | 8/2015 |
| WO | 2015/142492 A1 | 9/2015 |

OTHER PUBLICATIONS

Machine translation of WO-2010010607-A1, Sep. 2023.*
Cheah, Chi-Mun, et al., "Automatic Algorithm for Genereating Complex Polyhedral Scaffold Structure for Tissue Engineering", Tissue Engineering, Mar. 2004, pp. 595-610, vol. 10, No. 3/4, XP002691483.
Guibas, Leonidas J., et al., "Randomized Incremental Construction Of Delaunay And Voronoi Diagrams", Algorithmica, Jun. 1992, pp. 381-413, vol. 7, Issue 1-6, Springer-Verlag, New York.
Weigel, T., et al., "Design and Preparation Of Polymeric Scaffolds For Tissue Engineering." Expert Rev. Med. Devices, Nov. 2006, pp. 835-851, vol. 3, No. 6, XP002691485.
Yang, et al., "The Design of Scaffolds for Use in Tissue Engineering, Part II, Rapid Prototyping Techniques", Tissue Engineering, Feb. 2002, pp. 1-11, vol. 8, No. 1, XP002691484.
Gibson, D.W., et al., "Additive Manufacturing Technologies: Rapid Prototyping to Direct Digital Manufacturing", Jan. 2010, pp. 126-129, Springer, New York.
Motojima, Seiji, et al., "Chemical Vapor Growth Of LaB6 Whiskers And Crystals Having A Sharp Tip", Journal Of Crystal Growth, vol. 44, No. 1, Aug. 1, 1978 (Aug. 1, 1978), pp. 106-109.
Klassen, Alexander, et al., "Modelling of Electron Beam Absorption in Complex Geometries", Journal of Physics D: Applied Physics, Jan. 15, 2014, 12 pages, vol. 47, No. 6, Institute of Physics Publishing Ltd., Great Britain.
International Search Report and Written Opinion for application PCT/EP2016/070794 dated Nov. 24, 2016 (14 pages).
Office Action dated Sep. 19, 2019 pertaining to Chinese Patent Application No. 201680055597.7.
European Extended Search Report for EP Application No. 20165666.7 dated Sep. 18, 2020 (5 pages).
Chinese office action for application 202010935088.1 dated Nov. 3, 2021 (14 pages with English Translation).

* cited by examiner

X-RAY CALIBRATION STANDARD OBJECT

CROSS-REFERENCE TO RELATED APPLICATIONS

This application is a continuation of the U.S. patent application Ser. No. 15/245,542 filed Aug. 24, 2016, which claims the benefit of priority under 35 U.S.C. § 119(e) of U.S. Provisional Patent Application Ser. No. 62/232,135, filed Sep. 24, 2015, the contents of both of which are hereby incorporated by reference in their entirety.

BACKGROUND

Related Field

Various embodiments of the present invention relates to an X-ray standard reference object.

Description of Related Art

Freeform fabrication or additive manufacturing is a method for forming three-dimensional articles through successive fusion of chosen parts of powder layers applied to a worktable. A method and apparatus according to this technique is disclosed in U.S. Pat. No. 8,187,521.

Such an apparatus may comprise a work table on which the three-dimensional article is to be formed, a powder dispenser, arranged to lay down a thin layer of powder on the work table for the formation of a powder bed, an energy beam source for delivering an energy beam spot to the powder whereby fusion of the powder takes place, elements for control of the energy beam spot over the powder bed for the formation of a cross section of the three-dimensional article through fusion of parts of the powder bed, and a controlling computer, in which information is stored concerning consecutive cross sections of the three-dimensional article. A three-dimensional article is formed through consecutive fusions of consecutively formed cross sections of powder layers, successively laid down by the powder dispenser.

In order to melt the powder material at specific locations there is a need to inter alia verify the position and shape of the energy beam spot. One needs to know that the shape of the beam is within given tolerances at different positions on the work table. There is a need in the art to easily verify that an electron beam spot has correct shape and correct position.

BRIEF SUMMARY

Having this background, an object of the invention is to find means of calibration for an electron beam in an additive manufacturing apparatus which is accurate and easy to use.

The above-mentioned object is achieved by the features according to the claims contained herein.

In a first aspect of various embodiments of the invention it is provided an X-ray standard reference object for calibrating a scanning electron beam in an additive manufacturing apparatus by measuring X-ray signals generated by scanning the electron beam onto the reference object, the reference object comprises: a lower and an upper plate being essentially in parallel and attached spaced apart from each other, the upper plate comprises a plurality of holes, wherein a predetermined hollow pattern is provided inside the holes.

A non-limiting and exemplary advantage of this standard reference object is that it is relatively simple and inexpensive to manufacture at the same time as it provides for an accurate calibration of the electron beam before starting to manufacture three-dimensional articles in the additive manufacturing apparatus.

In various example embodiments the hollow pattern is a cross bar pattern. A non-limiting and exemplary advantage of this embodiment is that the relatively basic pattern provides for a quick and reliable characterization of the electron beam.

In various example embodiments the hollow pattern is equal for all holes. A non-limiting and exemplary advantage of this embodiment is that the pattern is easy to fabricate. In alternative various example embodiments the hollow pattern is different for different holes. The cross bar pattern could for instance be arranged symmetric in the hole for holes arranged in the center of the standard reference object and more and more asymmetric for holes further end further away from the center of the standard reference object.

In various example embodiments a spacing between the holes 20 and the size of the holes 20 in the first plate 10, 25 and the distance between the upper plate 19 and the lower plate 16 and the position of the x-ray sensor 360 with respect to the standard reference object 100 are arranged so that x-ray emanating from the lower plate 16, 49 when at least a portion of the electron beam is passing through a hollow part of the hollow pattern will not pass directly from the lower plate through any one of the holes 20 to the detector 360. A non-limiting and exemplary advantage of this embodiment is high accuracy with little or no noise signal.

In various example embodiments the upper and lower plates are made of the same material. A non-limiting and exemplary advantage of this embodiment is easy and cheap manufacturing.

In various example embodiments the upper plate comprises a first and a second plate, the first plate comprises the holes, the second plate comprises the predetermined hollow pattern and wherein the second plate faces towards the lower plate. A non-limiting and exemplary advantage of this embodiment is that the accuracy of the positioning, size and shape calibration may be improved since the thickness of the second plate comprising the predetermined hollow pattern may be relatively thin.

In various example embodiments the standard reference object comprising a third plate arranged so that the second plate is arranged in between the first and third plate. A non-limiting and exemplary advantage of this embodiment is that not only the first plate provides for cooling but also a third plate, i.e., cooling from both sides of the second plate which may be relatively warm during when scanning an electron beam over the predetermined pattern.

In various example embodiments the hollow pattern is made of a material having a higher atomic number than the first, third and/or lower plate. A non-limiting and exemplary advantage of this embodiment is that higher atomic number material may produce more x-ray signal at the same time as they can withstand heat better than low atomic number materials. This means that a thinner second plate may be manufactured without risking a deformation during the use of the standard reference object. The second plate may for instance be made of copper, molybdenum or tungsten or any alloy thereof, whereas the first, third and/or lower plate is made of aluminum.

In various example embodiments at least one hole in the first and/or the third plate may have slanted walls. A non-limiting and exemplary advantage of this embodiment is that relatively large standard reference objects may be used without risking worse accuracy closer to its periphery.

In various example embodiments the holes may have different angles of the slanted walls depending on the position of the holes on the standard reference object 100.

The slanted walls may be arrange din both the first plate and the third plate. Holes further away from the center of the standard reference object may have a larger angle with respect to the normal to the standard reference plate compared to holes closer to the center of the object. A larger deflection of the electron beam may require a larger angle with respect to the normal of the standard reference object for not hitting the first plate and/or the second plate instead of the predetermined pattern, i.e., if not slanting the walls of the holes more or less of the predetermined pattern will be hidden from the electron beam depending on the degree of deflection.

In another non-limiting and exemplary embodiment the pattern is a continuous pattern or a discontinuous pattern. A non-limiting and exemplary advantage of this embodiment is that any type of continuous or discontinuous pattern may be used for verifying the deflection speed.

BRIEF DESCRIPTION OF THE SEVERAL VIEWS OF THE DRAWINGS

Figure 1:
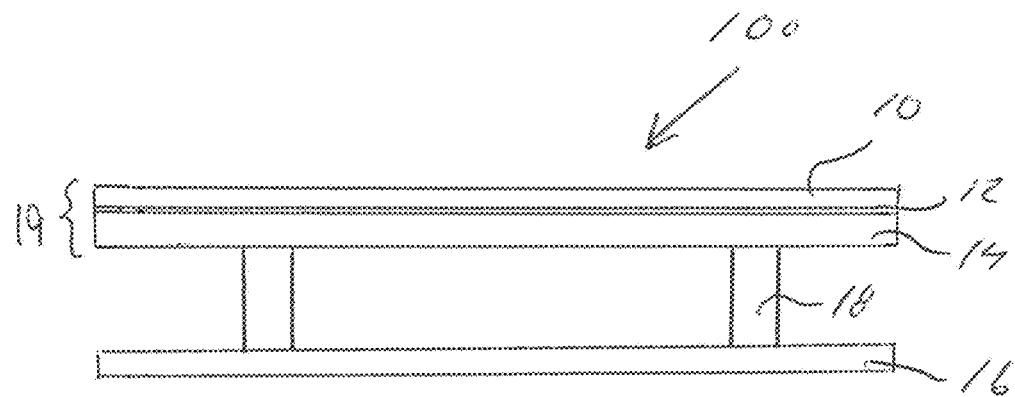
Figure 2:
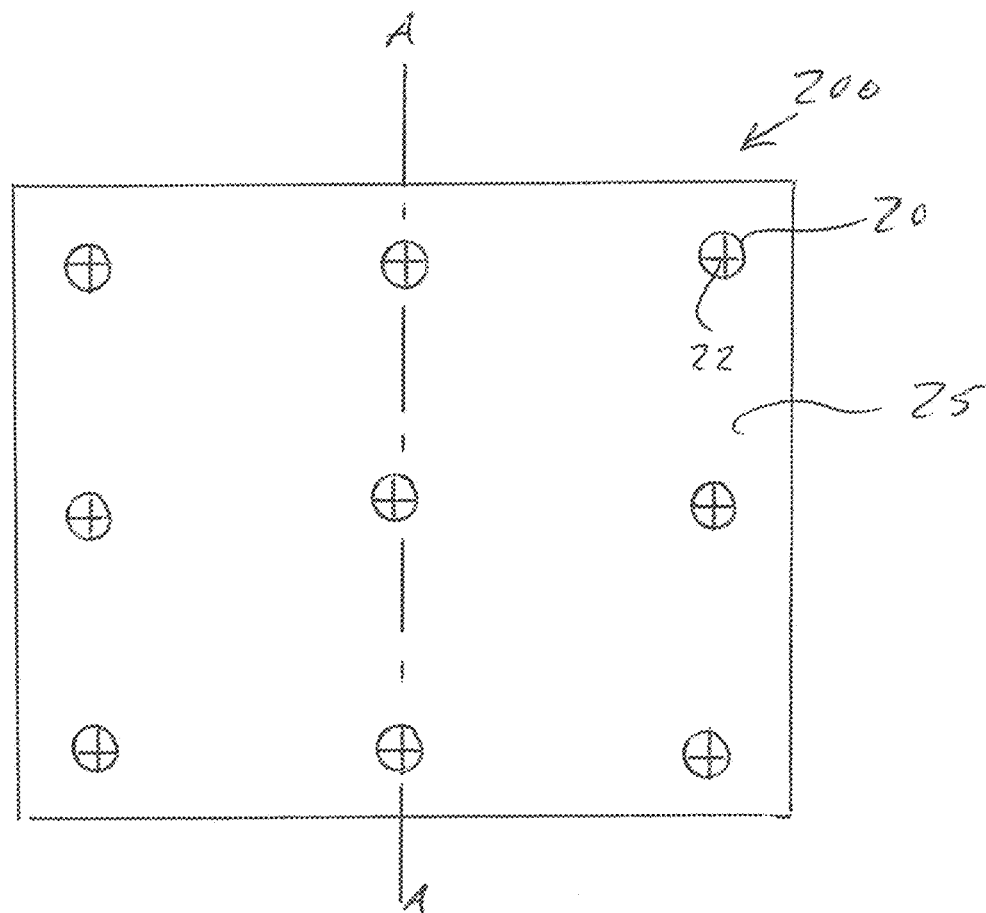
Figure 3:
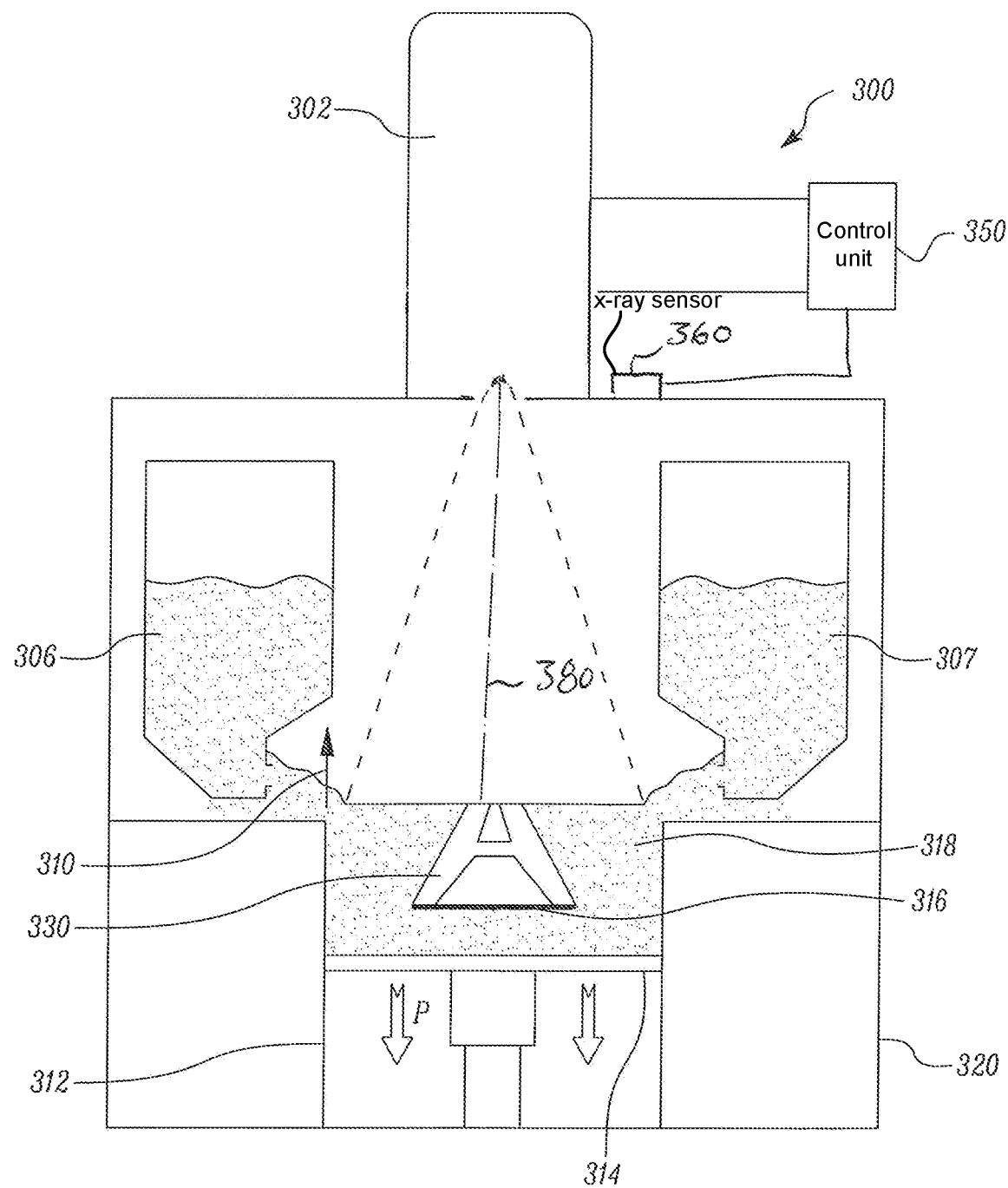
Figure 4A:
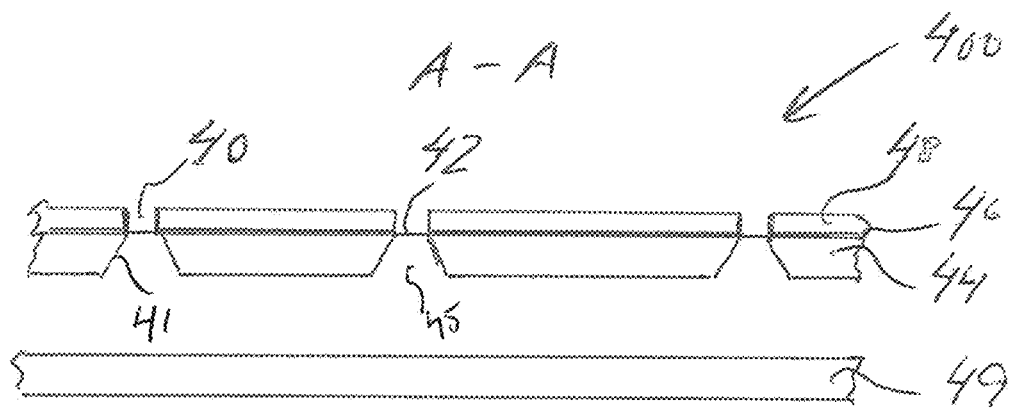
Figure 4B:
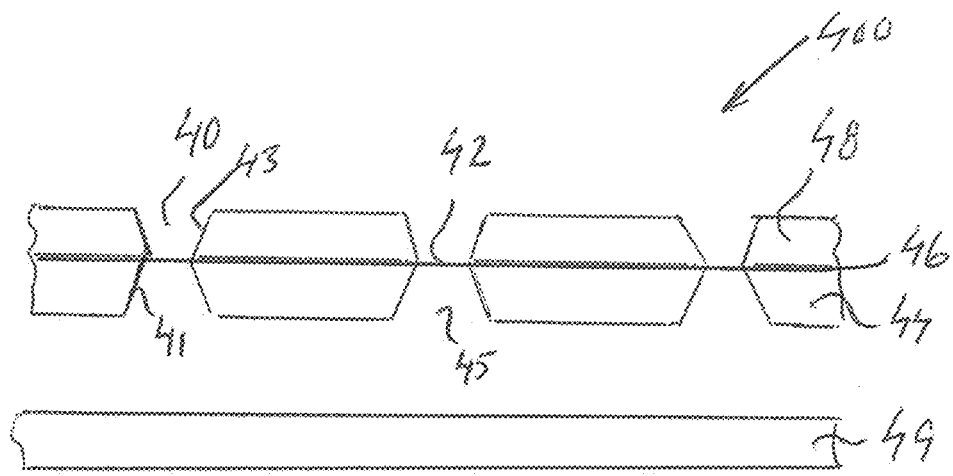

Having thus described the invention in general terms, reference will now be made to the accompanying drawings, which are not necessarily drawn to scale, and wherein:

FIG. 1 depicts a schematic side view of a first example embodiment of a standard reference object;

FIG. 2 depicts a schematic view from above of the first example embodiment of the standard reference object;

FIG. 3 depicts an apparatus in which the inventive standard reference object may be implemented;

FIG. 4A depicts a schematic cross section along A-A in FIG. 2 of the standard reference object; and FIG. 4B depicts an alternative cross section of the standard reference object.

Figure 5:
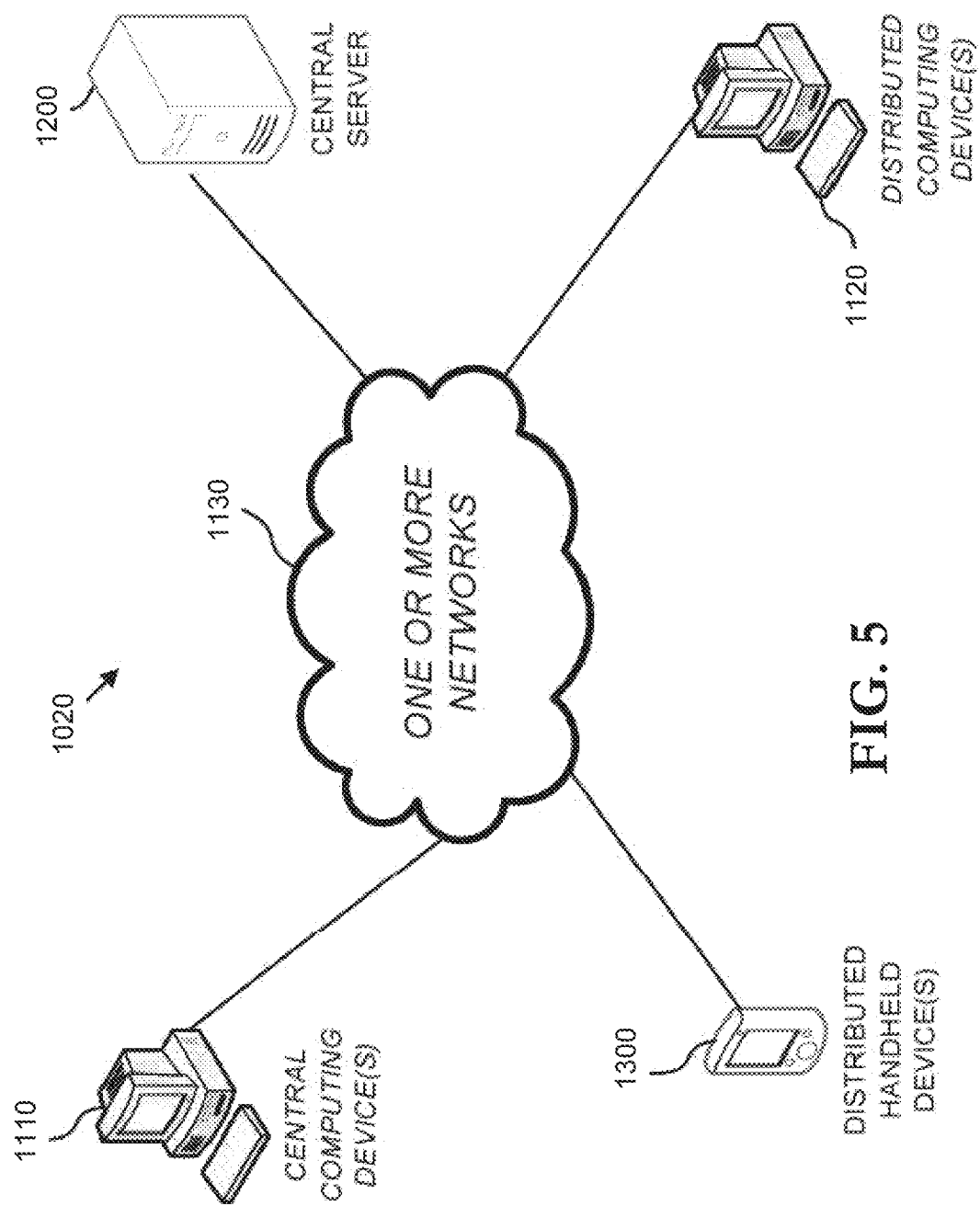
Figure 6A:
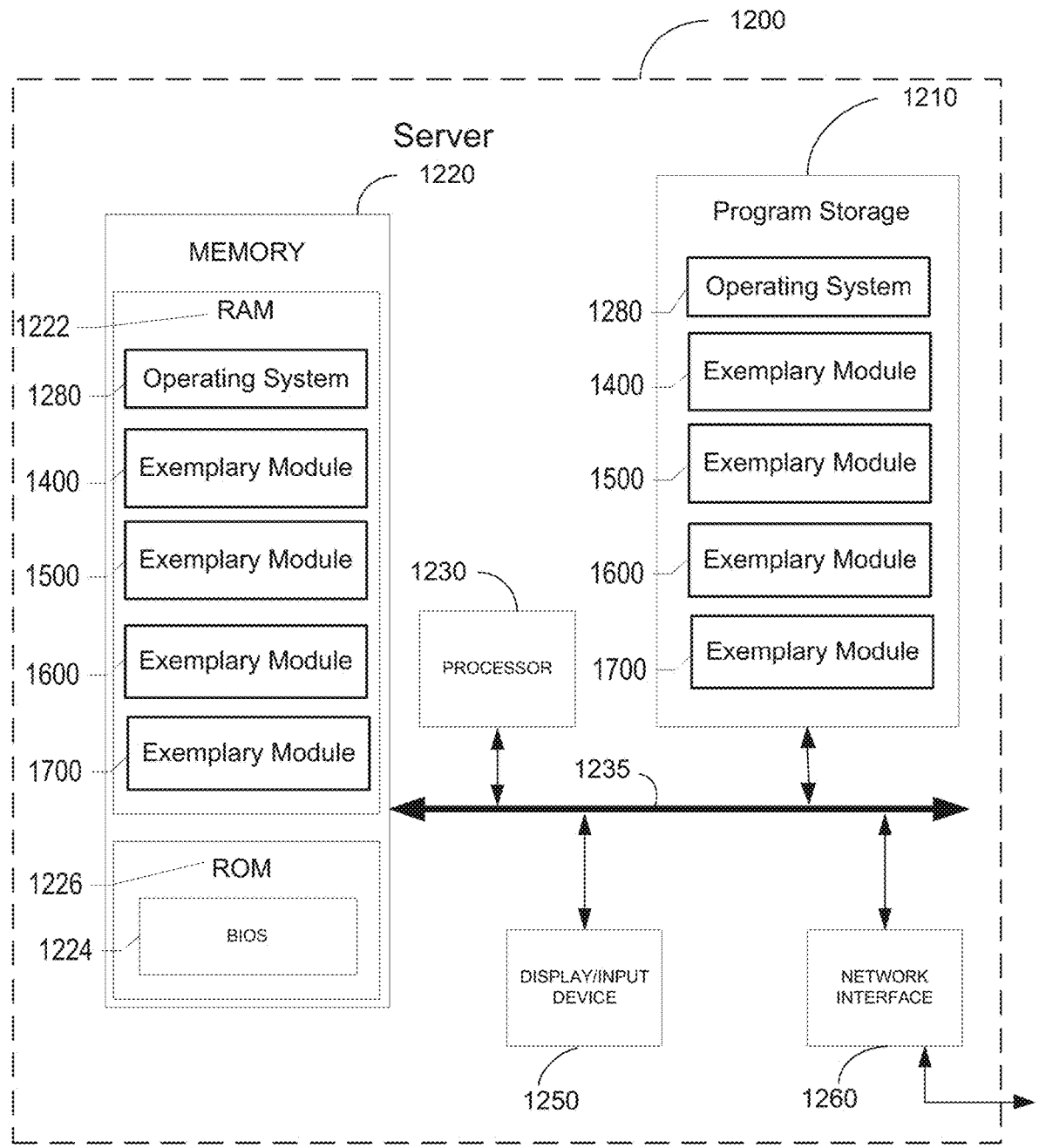

FIG. 5 is a block diagram of an exemplary system according to various embodiments of the present invention FIG. 6A is a schematic block diagram of a server according to various embodiments of the present invention.

Figure 6B:
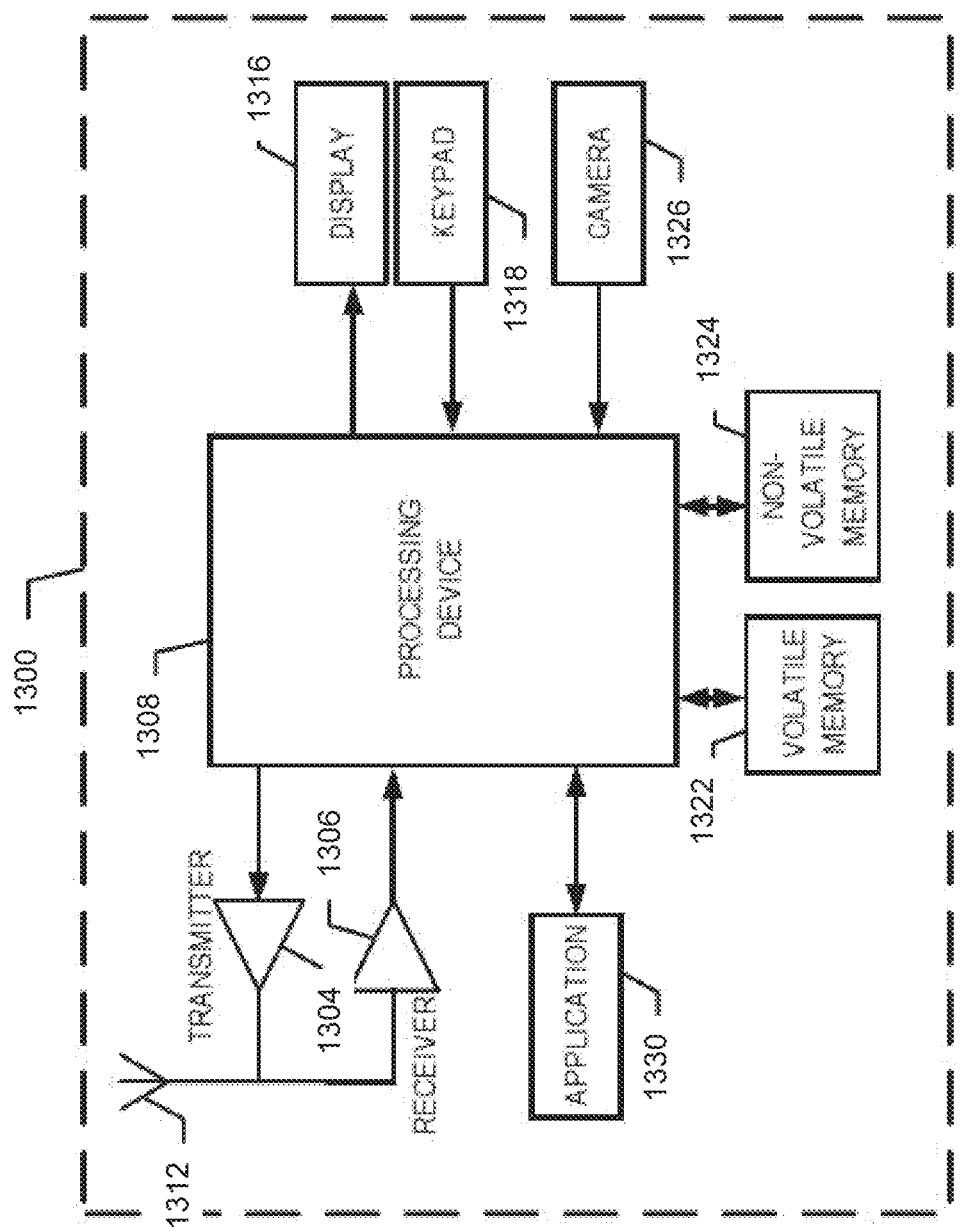

FIG. 6B is a schematic block diagram of an exemplary mobile device according to various embodiments of the present invention.

DETAILED DESCRIPTION OF VARIOUS EMBODIMENTS

Various embodiments of the present invention will now be described more fully hereinafter with reference to the accompanying drawings, in which some, but not all embodiments of the invention are shown. Indeed, embodiments of the invention may be embodied in many different forms and should not be construed as limited to the embodiments set forth herein. Rather, these embodiments are provided so that this disclosure will satisfy applicable legal requirements. Unless otherwise defined, all technical and scientific terms used herein have the same meaning as commonly known and understood by one of ordinary skill in the art to which the invention relates. The term "or" is used herein in both the alternative and conjunctive sense, unless otherwise indicated. Like numbers refer to like elements throughout.

Still further, to facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

The term "three-dimensional structures" and the like as used herein refer generally to intended or actually fabricated three-dimensional configurations (e.g., of structural material or materials) that are intended to be used for a particular purpose. Such structures, etc. may, for example, be designed with the aid of a three-dimensional CAD system.

The term "electron beam" as used herein in various embodiments refers to any charged particle beam. The sources of charged particle beam can include an electron gun, a linear accelerator and so on.

FIG. 3 depicts an example embodiment of a freeform fabrication or additive manufacturing apparatus 300 in which the inventive X-ray standard reference object may be implemented. The apparatus 300 in at least this embodiment comprises an electron gun 302; two powder hoppers 306, 307; a start plate 316; a build tank 312; a powder distributor 310; a build platform 314; an X-ray sensor 360; and a vacuum chamber 320.

The vacuum chamber 320 is capable of maintaining a vacuum environment by means of or via a vacuum system, which system may comprise a turbomolecular pump, a scroll pump, an ion pump and one or more valves which are well known to a skilled person in the art and therefore need no further explanation in this context. The vacuum system may be controlled by a control unit 350.

The electron gun 302 is generating an electron beam 380 which may be used for melting or fusing together powder material 318 provided on the start plate 316. The electron gun 302 may be provided in the vacuum chamber 320. The control unit 350 may be used for controlling and managing the electron beam 380 emitted from the electron beam gun 302. At least one focusing coil (not shown), at least one deflection coil (not shown) and an electron beam power supply (not shown) may be electrically connected to the control unit 350. In an example embodiment of the invention the electron gun generates a focusable electron beam with an accelerating voltage of about 60 kV and with a beam power in the range of 0-10 kW. The pressure in the vacuum chamber may be in the range of $1\times10^{-3}$-$1\times10^{-6}$ mBar when building the three-dimensional article by fusing the powder layer by layer with the energy beam.

The powder hoppers 306, 307 comprise the powder material to be provided on the start plate 316 in the build tank 312. The powder material may for instance be pure metals or metal alloys such as titanium, titanium alloys, aluminum, aluminum alloys, stainless steel, Co—Cr—W alloy, etc.

The powder distributor 310 is arranged to lay down a thin layer of the powder material on the start plate 316. During a work cycle the build platform 314 will be lowered successively in relation to the ray gun after each added layer of powder material. In order to make this movement possible, the build platform 314 is in one embodiment of the invention arranged movably in vertical direction, i.e., in the direction indicated by arrow P. This means that the build platform 314 starts in an initial position, in which a first powder material layer of necessary thickness has been laid down on the start plate 316. The build platform is thereafter lowered in connection with laying down a new powder material layer for the formation of a new cross section of a three-dimensional article. Means for lowering the build platform 314 may for instance be through a servo engine equipped with a gear, adjusting screws etc.

A model of the three dimensional article may be generated via a CAD (Computer Aided Design) tool.

After a first layer is finished, i.e., the fusion of powder material for making a first layer of the three-dimensional article, a second powder layer is provided on the work table 316. The second powder layer is distributed according to the same manner as the previous layer. However, there might be alternative methods in the same additive manufacturing machine for distributing powder onto the work table. For instance, a first layer may be provided by means of or via a first powder distributor, a second layer may be provided by another powder distributor. The design of the powder distributor is automatically changed according to instructions from the control unit. A powder distributor in the form of a single rake system, i.e., where one rake is catching powder fallen down from both a left powder hopper 306 and a right powder hopper 307, the rake as such can change design.

After having distributed the second powder layer on the work table 316, the electron beam 380 is directed over the build platform causing the second powder layer to fuse in selected locations to form a second cross section of the three-dimensional article. Fused portions in the second layer may be bonded to fused portions of the first layer. The fused portions in the first and second layer may be melted together by melting not only the powder in the uppermost layer but also remelting at least a fraction of a thickness of a layer directly below the uppermost layer.

FIG. 1 depicts a schematic side view of a first example embodiment of an X-ray standard reference object 100 according to the present invention. In this example embodiment the X-ray standard reference object 100 comprises a lower plate 16 and an upper plate 19 being attached spaced apart from each other so that the upper and lower plate 19 and 16 respectively are essentially parallel to each other. In FIG. 1 the upper and lower plates are attached to each other via a plurality of distances 18 which may be fastened to the upper and lower plates via screws or rivets or similar fastening elements. The lower plate 16 is essentially flat. The upper plate 19 comprises a predetermined number of holes 20, see FIG. 2. Inside the holes 20 it is arranged a predetermined hollow pattern 22.

In a first example embodiment the holes 20 and the pattern 22 is manufactured out of one and the same upper plate 19. The holes 20 with the pattern 22 may be manufactured through etching.

In a second example embodiment the upper plate comprises a first 10 and a second 12 plate, wherein the first plate 10 comprises the predetermined number of holes 20 and where the second plate 12 comprises the pattern 22. The holes 20 may be water cut or drilled. The second plate 12 may be a net having the predetermined pattern or a solid plate having the predetermined pattern only at selected locations aligned with the first plate's holes 20. The predetermined pattern is the second plate 12 may be made through etching. The second plate 12 is facing towards the lower plate 16. The second plate 12 may be thinner compared to the first plate 10. In various example embodiments the thickness of the second plate is 0.05-0.20 mm. In various example embodiments the thickness of the first and/or third plate may be a 1-3 cm. In various example embodiments the diameter of the holes 20 is 0.5-2 cm.

The bars in the predetermined pattern 22 may have sharp edges for improving the accuracy of the knife edge beam profiling method which may be used for determining the position, size and shape of the electron beam.

In various example embodiments a distance between the upper and lower plate may be 5-10 cm.

The second plate may be made of different material compared to the first plate. The second plate 12 may be made of a material having a larger atomic number than the first plate 10. The second plate may be made of Cu, or W whereas the first plate 10 may be made of μl. The pattern 22 may be a net with bars crossing each other at a predetermined angle. A lateral thickness of the bars may in an example embodiment be ⅓ of the diameter of the hole 20. In another example embodiment the lateral thickness of the bars may be ⅕ of the diameter or smaller.

In a third embodiment the upper plate 19 comprises a first, second and a third plate 10, 12, 14 respectively. The second plate 12, 46 is arranged in between the first 10 and third plate 14. The third plate may be essentially thicker than the first 48 and second plate 46, see FIG. 4A. In an example embodiment the third plate 44 is 5 times as thick as the first plate 48. The third plate 44, 14 comprises holes 45 aligned with the holes 40 in the first plate 10, 48. The holes 45 in the third plate 44 may have a conical shape denoted by 41 in FIG. 4A, i.e., having a larger diameter facing towards the lower plate 16, 49 than towards the second plate 12, 46. The conical shape is used for improving the signal/noise ratio for the x-ray signal. If using a straight cylinder, x-ray may emanate from its walls. By slanting the inner walls of the holes the x-ray signal may be heavily suppressed. The thickness of the third plate 44 and the distance between the third plate 44 and the lower plate 49, 16 may be adjusted in order to improve the signal/noise ratio as much as possible so that X-ray signals detected above the first plate 48 will emanate from the predetermined pattern 42 or the first plate 48, 10 only.

In the second and third embodiment the second plate may be made of a relatively heavy material compared to its surrounding, i.e., the first plate 10, 48 and third plate 14, 44.

A spacing between the holes 20 in the first plate 10, 25 and the distance between the upper plate 19 and the lower plate 16 and the position of the x-ray sensor 360 with respect to the standard reference object 100 are determined so that x-ray emanating from the lower plate 16, 49 will be out of sight for the detector 360, i.e., x-ray will not pass directly from the lower plate through the hole 20 to the detector 360.

The pattern 22 may be a cross pattern. The cross pattern may have its center in the center of the hole 20. Alternatively the center of the cross is not aligned with the center of the hole 20.

In various example embodiments different holes 20 may have different patterns. For instance a first hole may have a first cross pattern and a second hole 20 may have a second cross pattern. The difference between the cross pattern may be the angles between the cross bars.

FIG. 4B depicts an alternative cross section of the standard reference object. In this embodiment the first plate 48 is thicker than in the embodiment as shown in FIG. 4A. Because the first plate 48 is thicker the holes 40 in the first plate needs to have slanted walls 43. The reason for using the slanted walls is that the electron beam should be able to impinge on all areas of the predetermined pattern 42. Without slanted walls some regions of the pattern 22 will be out of sigh from the electron beam.

The first and third plate may be identical.

An angle of the slanted walls 41, 43 may be larger with respect to a normal to a surface of the standard reference object the further away the holes are from a center of the standard reference object. This means that in various example embodiments the holes may have different angles of the slanted walls depending on the position of the holes on the standard reference object 100.

The electron beam source 302 is used for generating an electron beam 380 which may be deflected on the work table 314 of or via at least one deflection coil (not shown) controlled by the control unit 350. By changing the magnetic field of the deflection coil the electron beam 380 may be moved at any desired position within a predetermined maximum area. A focus coil (not shown) may be used for changing the spot size of the electron beam on a target area. An astigmatism lens (not shown) may be used for changing the spot shape of the electron beam on the target area.

The X-ray standard reference object 100 may be used to calibrate an electron beam in an additive manufacturing apparatus. The x-ray standard reference object may be arranged on the build platform 314 before starting to manufacture any parts in the machine. An electron beam is swept over the x-ray standard reference object and an X-ray detector is used for collecting x-ray signals generated from the object 100 as the electron beam sweeps over it. The holes 20 are arranged at well-defined positions on the object 100. By analyzing the X-ray signal as the electron beam is sweeping over the object one may determine the shape, speed and absolute position of the electron beam. The spot size of the electron beam is typically smaller than the hollow portions of the predetermined pattern. As the electron beam is swept over a given hole one can determine the edge of the hole and the edge of the predetermined pattern as distinct signals. As the dimension of the holes and the predetermined pattern is known beforehand with high accuracy, one can from a given sweeping pattern determine the shape, position and scanning speed of the electron beam. Calibration parameters may be stored in a look-up table for use when manufacturing three-dimensional objects.

The beam characterization method that may be used is the "knife edge beam profiling method". When an electron beam hits the edge material (edge of the predetermined pattern), x-ray photons are generated and detected by the detector 361. The signal from the X-ray detector 361 as the beam is swept over the edge of the predetermined pattern may be recorded by an oscilloscope. The shape of the detected signal may then be translated to a beam diameter, beam shape and beam position. A position of the individual holes may be determined from a SEM image. The beam may then be swept over a predetermined hole 20 from left to right. When a first line is exposed a new scan starts with a predetermined shift in a vertical direction. The predetermined shift may be 0.2 mm. The procedure is repeated until the full predetermined pattern 22 is covered. The signal from the X-ray detector is recorded continuously by the oscilloscope from the first to the last scan line.

The beam size and position calibration exposure procedure is dependent on heat distribution and dissipation. Since exposing one single calibration site at a time would generate too much heat in the predetermined pattern 22 so that the material most probably will deteriorate. However, if several calibration sites (holes) are exposed in one single loop the heat generated in the predetermined pattern 22 will have to dissipate. From the detected oscilloscope signal it is possible, if enough samples are acquired, to determine the size, shape and position of the electron beam. The scan signal is basically the derivative of the corresponding Gaussian beam profile. The knife edge method optimizes an error function to the scan data by fitting the erf(r, a), where r is the $1/e^2$ radius and "a" is the flank position.

If the detected electron beam at a given position on the X-ray standard reference object is determined to be misshaped, adjustment by the astigmatism lens may correct for the beam shape distortions. X-ray detection may continue for the position during adjustment until a desired shape is achieved. By sweeping the electron beam across the pattern in different directions one may determine the shape of the electron beam spot with high accuracy for each and every position on the X-ray standard reference object.

If the detected electron beam at a given position on the X-ray standard reference object 100 is determined to be out of size, adjustment by the focus lens may correct for the beam size distortion. X-ray detection may continue for the position during adjustment until a desired size is achieved. By sweeping the electron beam across the pattern in different directions one may determine the size of the electron beam spot with high accuracy for each and every position on the X-ray standard reference object.

The use of the X-ray standard reference object may be before each new manufacture of the machine or after a predetermined number of manufactures. The X-ray standard reference object may be used as soon as a critical components has been renewed or exchanged in the additive manufacturing machine, such as exchange of electron filament.

In another aspect of the invention it is provided a program element configured and arranged, when executed on a computer, to implement a method for forming at least one three-dimensional article through successive joining of parts of a material layer. The program element may specifically be configured to perform the steps as outlined in the claim set provided herein.

The program element may be installed in one or more non-transitory computer readable storage mediums. The non-transitory computer readable storage mediums and/or the program element may be associated with a control unit, as described elsewhere herein. The computer readable storage mediums and the program elements, which may comprise non-transitory computer-readable program code portions embodied therein, may further be contained within one or more non-transitory computer program products. According to various embodiments, the method described elsewhere herein may be computer-implemented, for example in conjunction with one or more processors and/or memory storage areas.

As mentioned, various embodiments of the present invention may be implemented in various ways, including as non-transitory computer program products. A computer program product may include a non-transitory computer-readable storage medium storing applications, programs, program modules, scripts, source code, program code, object code, byte code, compiled code, interpreted code, machine code, executable instructions, and/or the like (also referred to herein as executable instructions, instructions for execution, program code, and/or similar terms used herein interchangeably). Such non-transitory computer-readable storage media include all computer-readable media (including volatile and non-volatile media).

In one embodiment, a non-volatile computer-readable storage medium may include a floppy disk, flexible disk, hard disk, solid-state storage (SSS) (e.g., a solid state drive (SSD), solid state card (SSC), solid state module (SSM)), enterprise flash drive, magnetic tape, or any other non-transitory magnetic medium, and/or the like. A non-volatile computer-readable storage medium may also include a punch card, paper tape, optical mark sheet (or any other physical medium with patterns of holes or other optically recognizable indicia), compact disc read only memory (CD- ROM), compact disc compact disc-rewritable (CD-RW), digital versatile disc (DVD), Blu-ray disc (BD), any other non-transitory optical medium, and/or the like. Such a non-volatile computer-readable storage medium may also include read-only memory (ROM), programmable read-only memory (PROM), erasable programmable read-only memory (EPROM), electrically erasable programmable read-only memory (EEPROM), flash memory (e.g., Serial, NAND, NOR, and/or the like), multimedia memory cards (MMC), secure digital (SD) memory cards, SmartMedia cards, CompactFlash (CF) cards, Memory Sticks, and/or the like. Further, a non-volatile computer-readable storage medium may also include conductive-bridging random access memory (CBRAM), phase-change random access memory (PRAM), ferroelectric random-access memory (FeRAM), non-volatile random-access memory (NVRAM), magnetoresistive random-access memory (MRAM), resistive random-access memory (RRAM), Silicon-Oxide-Nitride-Oxide-Silicon memory (SONOS), floating junction gate random access memory (FJG RAM), Millipede memory, racetrack memory, and/or the like.

In one embodiment, a volatile computer-readable storage medium may include random access memory (RAM), dynamic random access memory (DRAM), static random access memory (SRAM), fast page mode dynamic random access memory (FPM DRAM), extended data-out dynamic random access memory (EDO DRAM), synchronous dynamic random access memory (SDRAM), double data rate synchronous dynamic random access memory (DDR SDRAM), double data rate type two synchronous dynamic random access memory (DDR2 SDRAM), double data rate type three synchronous dynamic random access memory (DDR3 SDRAM), Rambus dynamic random access memory (RDRAM), Twin Transistor RAM (TTRAM), Thyristor RAM (T-RAM), Zero-capacitor (Z-RAM), Rambus in-line memory module (RIMM), dual in-line memory module (DIMM), single in-line memory module (SIMM), video random access memory VRAM, cache memory (including various levels), flash memory, register memory, and/or the like. It will be appreciated that where embodiments are described to use a computer-readable storage medium, other types of computer-readable storage media may be substituted for or used in addition to the computer-readable storage media described above.

As should be appreciated, various embodiments of the present invention may also be implemented as methods, apparatus, systems, computing devices, computing entities, and/or the like, as have been described elsewhere herein. As such, embodiments of the present invention may take the form of an apparatus, system, computing device, computing entity, and/or the like executing instructions stored on a computer-readable storage medium to perform certain steps or operations. However, embodiments of the present invention may also take the form of an entirely hardware embodiment performing certain steps or operations.

Various embodiments are described below with reference to block diagrams and flowchart illustrations of apparatuses, methods, systems, and computer program products. It should be understood that each block of any of the block diagrams and flowchart illustrations, respectively, may be implemented in part by computer program instructions, e.g., as logical steps or operations executing on a processor in a computing system. These computer program instructions may be loaded onto a computer, such as a special purpose computer or other programmable data processing apparatus to produce a specifically-configured machine, such that the instructions which execute on the computer or other programmable data processing apparatus implement the functions specified in the flowchart block or blocks.

These computer program instructions may also be stored in a computer-readable memory that can direct a computer or other programmable data processing apparatus to function in a particular manner, such that the instructions stored in the computer-readable memory produce an article of manufacture including computer-readable instructions for implementing the functionality specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide operations for implementing the functions specified in the flowchart block or blocks.

Accordingly, blocks of the block diagrams and flowchart illustrations support various combinations for performing the specified functions, combinations of operations for performing the specified functions and program instructions for performing the specified functions. It should also be understood that each block of the block diagrams and flowchart illustrations, and combinations of blocks in the block diagrams and flowchart illustrations, could be implemented by special purpose hardware-based computer systems that perform the specified functions or operations, or combinations of special purpose hardware and computer instructions.

FIG. 5 is a block diagram of an exemplary system 1020 that can be used in conjunction with various embodiments of the present invention. In at least the illustrated embodiment, the system 1020 may include one or more central computing devices 1110, one or more distributed computing devices 1120, and one or more distributed handheld or mobile devices 1300, all configured in communication with a central server 1200 (or control unit) via one or more networks 1130. While FIG. 5 illustrates the various system entities as separate, standalone entities, the various embodiments are not limited to this particular architecture.

According to various embodiments of the present invention, the one or more networks 1130 may be capable of supporting communication in accordance with any one or more of a number of second-generation (2G), 2.5G, third-generation (3G), and/or fourth-generation (4G) mobile communication protocols, or the like. More particularly, the one or more networks 1130 may be capable of supporting communication in accordance with 2G wireless communication protocols IS-136 (TDMA), GSM, and IS-95 (CDMA). Also, for example, the one or more networks 1130 may be capable of supporting communication in accordance with 2.5G wireless communication protocols GPRS, Enhanced Data GSM Environment (EDGE), or the like. In addition, for example, the one or more networks 1130 may be capable of supporting communication in accordance with 3G wireless communication protocols such as Universal Mobile Telephone System (UMTS) network employing Wideband Code Division Multiple Access (WCDMA) radio access technology. Some narrow-band AMPS (NAMPS), as well as TACS, network(s) may also benefit from embodiments of the present invention, as should dual or higher mode mobile stations (e.g., digital/analog or TDMA/CDMA/analog phones). As yet another example, each of the components of the system 1020 may be configured to communicate with one another in accordance with techniques such as, for example, radio frequency (RF), Bluetooth™ infrared (IrDA), or any of a number of different wired or wireless networking techniques, including a wired or wireless Personal Area Network ("PAN"), Local Area Network ("LAN"), Metropolitan Area Network ("MAN"), Wide Area Network ("WAN"), or the like.

Although the device(s) 1110-1300 are illustrated in FIG. 5 as communicating with one another over the same network 1130, these devices may likewise communicate over multiple, separate networks.

According to one embodiment, in addition to receiving data from the server 1200, the distributed devices 1110, 1120, and/or 1300 may be further configured to collect and transmit data on their own. In various embodiments, the devices 1110, 1120, and/or 1300 may be capable of receiving data via one or more input units or devices, such as a keypad, touchpad, barcode scanner, radio frequency identification (RFID) reader, interface card (e.g., modem, etc.) or receiver. The devices 1110, 1120, and/or 1300 may further be capable of storing data to one or more volatile or non-volatile memory modules, and outputting the data via one or more output units or devices, for example, by displaying data to the user operating the device, or by transmitting data, for example over the one or more networks 1130.

In various embodiments, the server 1200 includes various systems for performing one or more functions in accordance with various embodiments of the present invention, including those more particularly shown and described herein. It should be understood, however, that the server 1200 might include a variety of alternative devices for performing one or more like functions, without departing from the spirit and scope of the present invention. For example, at least a portion of the server 1200, in certain embodiments, may be located on the distributed device(s) 1110, 1120, and/or the handheld or mobile device(s) 1300, as may be desirable for particular applications. As will be described in further detail below, in at least one embodiment, the handheld or mobile device(s) 1300 may contain one or more mobile applications 1330 which may be configured so as to provide a user interface for communication with the server 1200, all as will be likewise described in further detail below.

FIG. 6A is a schematic diagram of the server 1200 according to various embodiments. The server 1200 includes a processor 1230 that communicates with other elements within the server via a system interface or bus 1235. Also included in the server 1200 is a display/input device 1250 for receiving and displaying data. This display/input device 1250 may be, for example, a keyboard or pointing device that is used in combination with a monitor. The server 1200 further includes memory 1220, which typically includes both read only memory (ROM) 1226 and random access memory (RAM) 1222. The server's ROM 1226 is used to store a basic input/output system 1224 (BIOS), containing the basic routines that help to transfer information between elements within the server 1200. Various ROM and RAM configurations have been previously described herein.

In addition, the server 1200 includes at least one storage device or program storage 210, such as a hard disk drive, a floppy disk drive, a CD Rom drive, or optical disk drive, for storing information on various computer-readable media, such as a hard disk, a removable magnetic disk, or a CD-ROM disk. As will be appreciated by one of ordinary skill in the art, each of these storage devices 1210 are connected to the system bus 1235 by an appropriate interface. The storage devices 1210 and their associated computer-readable media provide nonvolatile storage for a personal computer. As will be appreciated by one of ordinary skill in the art, the computer-readable media described above could be replaced by any other type of computer-readable media known in the art. Such media include, for example, magnetic cassettes, flash memory cards, digital video disks, and Bernoulli cartridges.

Although not shown, according to an embodiment, the storage device 1210 and/or memory of the server 1200 may further provide the functions of a data storage device, which may store historical and/or current delivery data and delivery conditions that may be accessed by the server 1200. In this regard, the storage device 1210 may comprise one or more databases. The term "database" refers to a structured collection of records or data that is stored in a computer system, such as via a relational database, hierarchical database, or network database and as such, should not be construed in a limiting fashion.

A number of program modules (e.g., exemplary modules 1400-1700) comprising, for example, one or more computer-readable program code portions executable by the processor 1230, may be stored by the various storage devices 1210 and within RAM 1222. Such program modules may also include an operating system 1280. In these and other embodiments, the various modules 1400, 1500, 1600, 1700 control certain aspects of the operation of the server 1200 with the assistance of the processor 1230 and operating system 1280. In still other embodiments, it should be understood that one or more additional and/or alternative modules may also be provided, without departing from the scope and nature of the present invention.

In various embodiments, the program modules 1400, 1500, 1600, 1700 are executed by the server 1200 and are configured to generate one or more graphical user interfaces, reports, instructions, and/or notifications/alerts, all accessible and/or transmittable to various users of the system 1020. In certain embodiments, the user interfaces, reports, instructions, and/or notifications/alerts may be accessible via one or more networks 1130, which may include the Internet or other feasible communications network, as previously discussed.

In various embodiments, it should also be understood that one or more of the modules 1400, 1500, 1600, 1700 may be alternatively and/or additionally (e.g., in duplicate) stored locally on one or more of the devices 1110, 1120, and/or 1300 and may be executed by one or more processors of the same. According to various embodiments, the modules 1400, 1500, 1600, 1700 may send data to, receive data from, and utilize data contained in one or more databases, which may be comprised of one or more separate, linked and/or networked databases.

Also located within the server 1200 is a network interface 1260 for interfacing and communicating with other elements of the one or more networks 1130. It will be appreciated by one of ordinary skill in the art that one or more of the server 1200 components may be located geographically remotely from other server components. Furthermore, one or more of the server 1200 components may be combined, and/or additional components performing functions described herein may also be included in the server.

While the foregoing describes a single processor 1230, as one of ordinary skill in the art will recognize, the server 1200 may comprise multiple processors operating in conjunction with one another to perform the functionality described herein. In addition to the memory 1220, the processor 1230 can also be connected to at least one interface or other means for displaying, transmitting and/or receiving data, content or the like. In this regard, the interface(s) can include at least one communication interface or other means for transmitting and/or receiving data, content or the like, as well as at least one user interface that can include a display and/or a user input interface, as will be described in further detail below. The user input interface, in turn, can comprise any of a number of devices allowing the entity to receive data from a user, such as a keypad, a touch display, a joystick or other input device.

Still further, while reference is made to the "server" 1200, as one of ordinary skill in the art will recognize, embodiments of the present invention are not limited to traditionally defined server architectures. Still further, the system of embodiments of the present invention is not limited to a single server, or similar network entity or mainframe computer system. Other similar architectures including one or more network entities operating in conjunction with one another to provide the functionality described herein may likewise be used without departing from the spirit and scope of embodiments of the present invention. For example, a mesh network of two or more personal computers (PCs), similar electronic devices, or handheld portable devices, collaborating with one another to provide the functionality described herein in association with the server 1200 may likewise be used without departing from the spirit and scope of embodiments of the present invention.

According to various embodiments, many individual steps of a process may or may not be carried out utilizing the computer systems and/or servers described herein, and the degree of computer implementation may vary, as may be desirable and/or beneficial for one or more particular applications.

FIG. 6B provides an illustrative schematic representative of a mobile device 1300 that can be used in conjunction with various embodiments of the present invention. Mobile devices 1300 can be operated by various parties. As shown in FIG. 6B, a mobile device 1300 may include an antenna 1312, a transmitter 1304 (e.g., radio), a receiver 1306 (e.g., radio), and a processing element 1308 that provides signals to and receives signals from the transmitter 1304 and receiver 1306, respectively.

The signals provided to and received from the transmitter 1304 and the receiver 1306, respectively, may include signaling data in accordance with an air interface standard of applicable wireless systems to communicate with various entities, such as the server 1200, the distributed devices 1110, 1120, and/or the like. In this regard, the mobile device 1300 may be capable of operating with one or more air interface standards, communication protocols, modulation types, and access types. More particularly, the mobile device 1300 may operate in accordance with any of a number of wireless communication standards and protocols. In a particular embodiment, the mobile device 1300 may operate in accordance with multiple wireless communication standards and protocols, such as GPRS, UMTS, CDMA2000, 1×RTT, WCDMA, TD-SCDMA, LTE, E-UTRAN, EVDO, HSPA, HSDPA, Wi-Fi, WiMAX, UWB, IR protocols, Bluetooth protocols, USB protocols, and/or any other wireless protocol.

Via these communication standards and protocols, the mobile device 1300 may according to various embodiments communicate with various other entities using concepts such as Unstructured Supplementary Service data (USSD), Short Message Service (SMS), Multimedia Messaging Service (MMS), Dual-Tone Multi-Frequency Signaling (DTMF), and/or Subscriber Identity Module Dialer (SIM dialer). The mobile device 1300 can also download changes, add-ons, and updates, for instance, to its firmware, software (e.g., including executable instructions, applications, program modules), and operating system.

According to one embodiment, the mobile device 1300 may include a location determining device and/or functionality. For example, the mobile device 1300 may include a GPS module adapted to acquire, for example, latitude, longitude, altitude, geocode, course, and/or speed data. In one embodiment, the GPS module acquires data, sometimes known as ephemeris data, by identifying the number of satellites in view and the relative positions of those satellites.

The mobile device 1300 may also comprise a user interface (that can include a display 1316 coupled to a processing element 1308) and/or a user input interface (coupled to a processing element 308). The user input interface can comprise any of a number of devices allowing the mobile device 1300 to receive data, such as a keypad 1318 (hard or soft), a touch display, voice or motion interfaces, or other input device. In embodiments including a keypad 1318, the keypad can include (or cause display of) the conventional numeric (0-9) and related keys (#, *), and other keys used for operating the mobile device 1300 and may include a full set of alphabetic keys or set of keys that may be activated to provide a full set of alphanumeric keys. In addition to providing input, the user input interface can be used, for example, to activate or deactivate certain functions, such as screen savers and/or sleep modes.

The mobile device 1300 can also include volatile storage or memory 1322 and/or non-volatile storage or memory 1324, which can be embedded and/or may be removable. For example, the non-volatile memory may be ROM, PROM, EPROM, EEPROM, flash memory, MMCs, SD memory cards, Memory Sticks, CBRAM, PRAM, FeRAM, RRAM, SONOS, racetrack memory, and/or the like. The volatile memory may be RAM, DRAM, SRAM, FPM DRAM, EDO DRAM, SDRAM, DDR SDRAM, DDR2 SDRAM, DDR3 SDRAM, RDRAM, RIMM, DIMM, SIMM, VRAM, cache memory, register memory, and/or the like. The volatile and non-volatile storage or memory can store databases, database instances, database mapping systems, data, applications, programs, program modules, scripts, source code, object code, byte code, compiled code, interpreted code, machine code, executable instructions, and/or the like to implement the functions of the mobile device 1300.

The mobile device 1300 may also include one or more of a camera 1326 and a mobile application 1330. The camera 1326 may be configured according to various embodiments as an additional and/or alternative data collection feature, whereby one or more items may be read, stored, and/or transmitted by the mobile device 1300 via the camera. The mobile application 1330 may further provide a feature via which various tasks may be performed with the mobile device 1300. Various configurations may be provided, as may be desirable for one or more users of the mobile device 1300 and the system 1020 as a whole.

It will be appreciated that many variations of the above systems and methods are possible, and that deviation from the above embodiments are possible, but yet within the scope of the claims. Many modifications and other embodiments of the invention set forth herein will come to mind to one skilled in the art to which these inventions pertain having the benefit of the teachings presented in the foregoing descriptions and the associated drawings. Such modifications may, for example, involve using different materials in the X-ray standard reference object. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. A standard reference plate configured for insertion into an electron beam additive manufacturing apparatus for calibrating a size, shape, and position of an electron beam of the electron beam additive manufacturing apparatus, wherein the standard reference plate is configured for removal from the additive manufacturing apparatus after the calibrating, the standard reference plate comprising:
a lower plate and an upper plate being essentially in parallel and attached spaced apart from each other, the upper plate comprising a plurality of holes, wherein a predetermined hollow pattern is provided inside the holes, wherein a spacing between the holes and the size of the holes and a distance between the upper plate and the lower plate and a position of an x-ray sensor of the additive manufacturing apparatus with respect to the standard reference plate are arranged so that x-rays emanating from the lower plate, when at least a portion of the electron beam is passing through a hollow part of the hollow pattern, will not pass directly from the lower plate through any one of the holes to the x-ray sensor.

2. The standard reference plate of claim 1, wherein:
the upper plate comprises a first and a second plate;
the first plate comprises the plurality of holes; and
the second plate comprises the predetermined hollow pattern.

3. The standard reference plate of claim 2, wherein the second plate has a thickness that is at most one fifth of a thickness of the first plate.

4. The standard reference plate of claim 2, wherein:
the upper plate further comprises a third plate comprising an additional plurality of holes aligned with the plurality of holes of the first plate; and
the second plate is positioned between the first plate and the third plate.

5. The standard reference plate of claim 4, wherein the third plate is thicker than both the first plate and the second plate.

6. The standard reference plate of claim 4, wherein the plurality of additional holes in the third plate have a conical shape such that diameter of each of the plurality of additional holes increases with decreasing distance from the lower plate.

7. The standard reference plate of claim 4, wherein second plate is constructed from a heavier material than the first and third plates.

8. The standard reference plate according to claim 1, wherein the hollow pattern is a cross bar pattern.

9. The standard reference plate according to claim 1, wherein the hollow pattern is identical for all holes.

10. The standard reference plate according to claim 1, wherein the upper and lower plates are made of the same material.

11. A standard reference plate configured for insertion into an electron beam additive manufacturing apparatus for calibrating a size, shape, and position of an electron beam of the electron beam additive manufacturing apparatus, wherein the standard reference plate is configured for removal from the additive manufacturing apparatus after the calibrating, the standard reference plate comprising:
an upper plate comprising a first plate and a second plate, wherein the first plate comprises a plurality of holes and the second plate comprises a predetermined hollow pattern aligned with the plurality of holes; and
a lower plate spaced apart from the upper plate, wherein a spacing between the holes and a size of the holes and a distance between the upper plate and the lower plate and a position of an x-ray sensor of the additive manufacturing apparatus with respect to the standard reference plate are arranged so that x-rays emanating from the lower plate, when at least a portion of the electron beam is passing through a hollow part of the hollow pattern, will not pass directly from the lower plate through any one of the plurality of holes to the x-ray sensor.

12. The standard reference plate of claim 11, wherein:
the upper plate further comprises a third plate comprising an additional plurality of holes aligned with the plurality of holes of the first plate; and
the second plate is positioned between the first plate and the third plate.

13. The standard reference plate of claim 12, wherein the third plate is thicker than both the first plate and the second plate.

14. The standard reference plate of claim 12, wherein the plurality of additional holes in the third plate have a conical shape such that diameter of each of the plurality of additional holes increases with decreasing distance from the lower plate.

15. The standard reference plate of claim 12, wherein second plate is constructed from a heavier material than the first and third plates.

16. The standard reference plate of claim 11, wherein the hollow pattern is made of a material having a higher atomic number than the first plate.

17. The standard reference plate according to claim 11, wherein the hollow pattern is a cross bar pattern.

18. The standard reference plate according to claim 11, wherein the hollow pattern is identical for all holes.

19. The standard reference plate according to claim 11, wherein the upper and lower plates are made of the same material.

20. A method of using a standard reference plate in an additive manufacturing apparatus having an electron beam for melting powder layer by layer according to a predetermined pattern, the standard reference plate comprises:
a lower and an upper plate being essentially in parallel and attached spaced apart from each other, the upper plate comprising a plurality of holes, wherein a predetermined hollow pattern is provided-inside the holes, wherein the upper plate comprises a first and a second plate, the first plate comprising the holes, the second plate comprising the predetermined hollow pattern and wherein the second plate is positioned between the first plate and the lower plate, wherein a spacing between the holes and a size of the holes in the first plate and a distance between the upper plate and the lower plate and a position of an x-ray sensor with respect to the standard reference plate are arranged so that x-rays emanating from the lower plate, when at least a portion of the electron beam is passing through a hollow part of the hollow pattern, will not pass directly from the lower plate through any one of the plurality of holes to the x-ray sensor, wherein the method comprises:
inserting the standard reference plate for calibrating a size, shape and position of an electron beam;
removing, after the standard reference plate is inserted, the standard reference plate; and manufacturing, after the standard reference plate is removed, one or more three-dimensional articles with the additive manufacturing apparatus.

\* \* \* \* \*